(12) United States Patent
Chen et al.

(10) Patent No.: US 8,247,957 B2
(45) Date of Patent: Aug. 21, 2012

(54) LED MODULE

(75) Inventors: Chin-Chung Chen, Taipei Hsien (TW); Hai-Wei Zhang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 484 days.

(21) Appl. No.: 12/605,381

(22) Filed: Oct. 26, 2009

(65) Prior Publication Data
US 2010/0259151 A1 Oct. 14, 2010

(30) Foreign Application Priority Data
Apr. 14, 2009 (CN) .......................... 2009 1 0301558

(51) Int. Cl.
*H01J 1/00* (2006.01)
(52) U.S. Cl. .................... 313/110; 362/240; 362/249.02
(58) Field of Classification Search .......... 313/484–487, 313/489, 498, 512, 467, 468, 499, 501–503; 257/98–100, 79, 80; 362/235, 227, 231, 362/293, 545, 800; 345/44, 46; 438/22, 438/26, 458
See application file for complete search history.

(56) References Cited

U.S. PATENT DOCUMENTS
2002/0080615 A1* 6/2002 Marshall et al. .............. 362/333
2004/0136197 A1* 7/2004 Ishida ........................... 362/487

FOREIGN PATENT DOCUMENTS
CN 201184521 Y 1/2009

* cited by examiner

*Primary Examiner* — Anh Mai
*Assistant Examiner* — Elmito Breval
(74) *Attorney, Agent, or Firm* — Altis Law Group, Inc.

(57) ABSTRACT

An LED module comprises an LED having a first optical axis and a lens fixed over the LED for refracting light emitted from the LED. The lens comprises an emission surface having a second optical axis and an incidence surface having a third optical axis. The second optical axis of the emission surface offsets from the first optical axis of the LED in a first direction for increasing a light intensity at a side of the first optical axis in the first direction. The first, second and third optical axes are in a line along the first direction. The third optical axis offsets from the first optical axis of the LED at a side opposite to that of the second optical axis.

17 Claims, 4 Drawing Sheets

LED MODULE

BACKGROUND

1. Technical Field

The present disclosure relates generally to an LED module, and more particularly to an LED module for lighting.

2. Description of Related Art

LED street lamp, a solid-state lighting, utilizes LEDs as a source of illumination, providing advantages such as resistance to shock and nearly limitless lifetime under specific conditions. Thus, LED lamps present a cost-effective yet high quality replacement for incandescent and fluorescent lamps.

A typical LED street lamp includes a housing and a plurality of LEDs mounted in the housing. When the LED street lamp is mounted at a side of a road, light generated by the LEDs must be adjusted to illuminate a middle of the road thereby providing a sufficient illumination for cars which are running on the road. In order to solve the problem, a plurality of inclined supporting frames are mounted in the housing of the LED street lamp for supporting the LEDs so that the light generated by the LEDs illuminates the middle of the road. However, the inclined supporting frames are larger in size and weight, which results in the inconvenience of assembly.

What is need therefore is an LED module having a design which can overcome the above limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
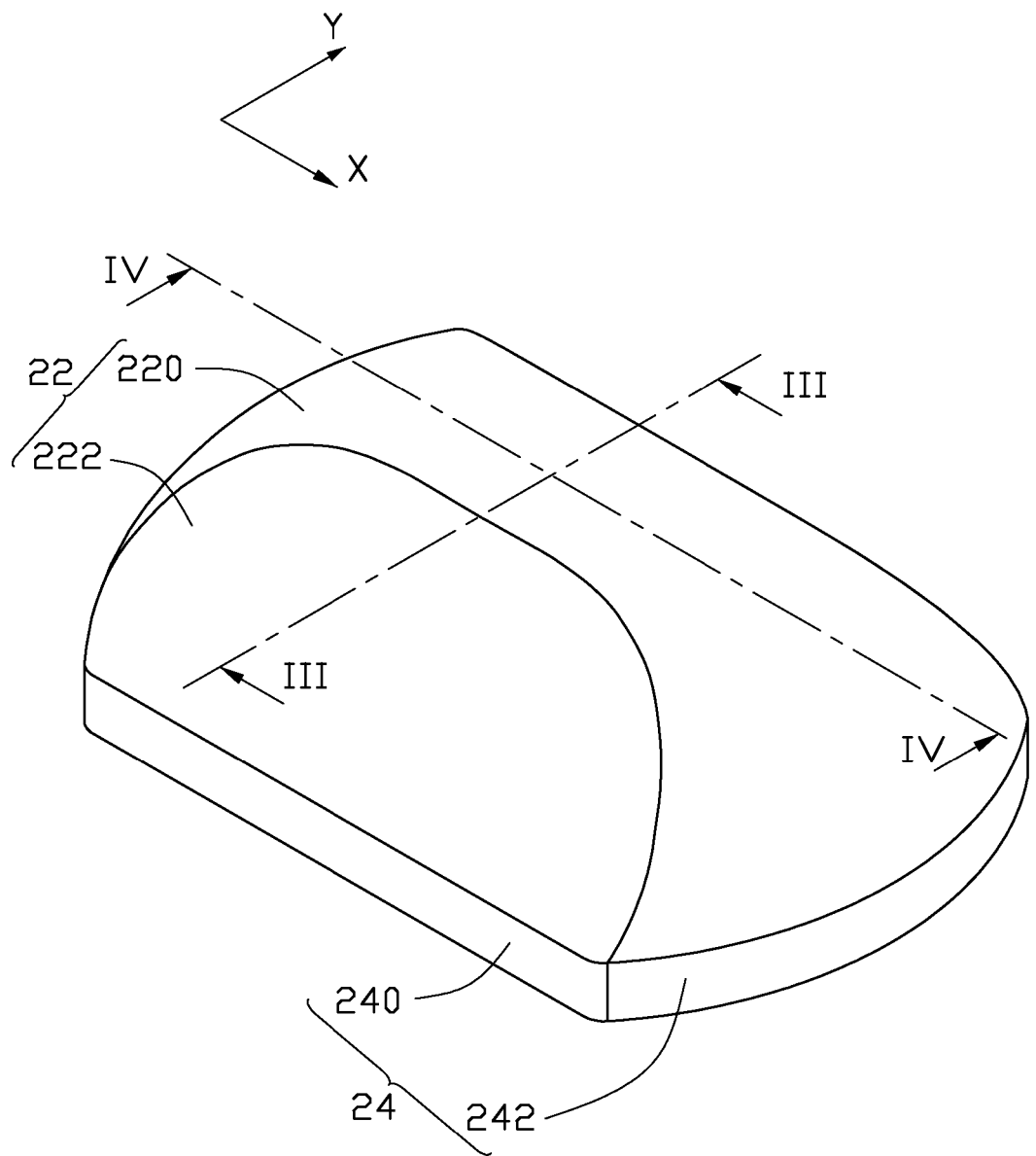
FIG. 1 is an isometric, assembled view of an LED module in accordance with an embodiment of the present disclosure.
Figure 2:
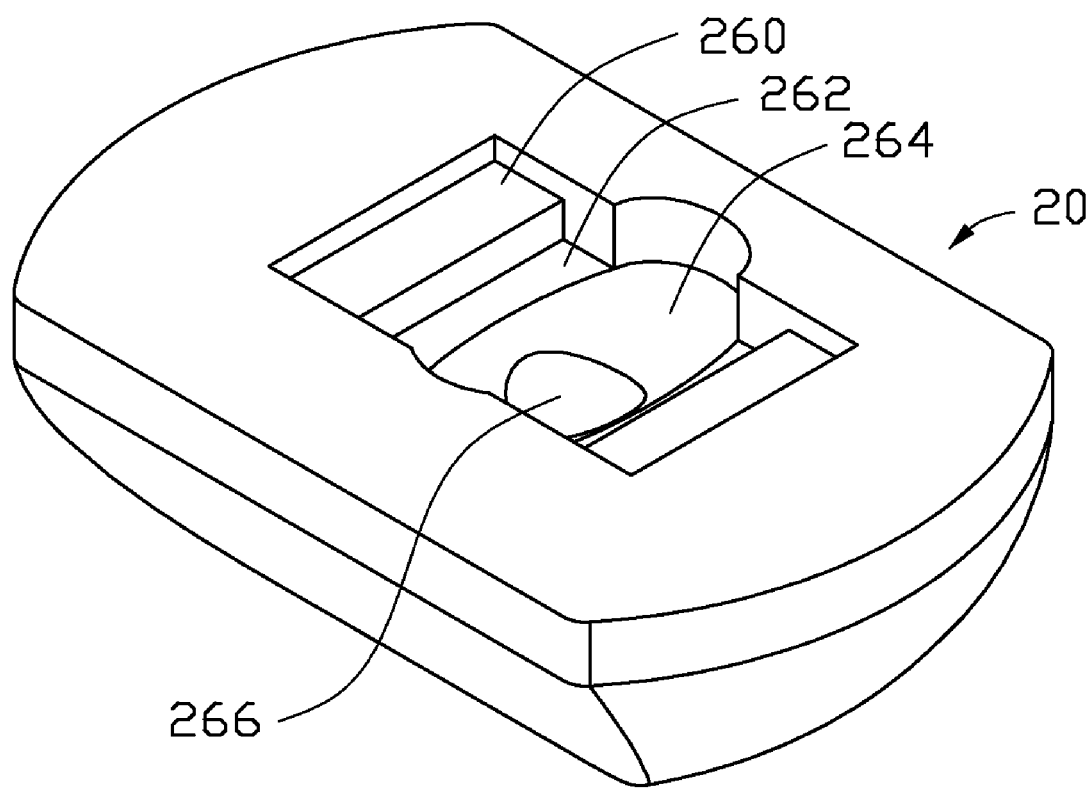
FIG. 2 is an inverted view of the LED module of FIG. 1, with an LED thereof being removed away.
Figure 3:
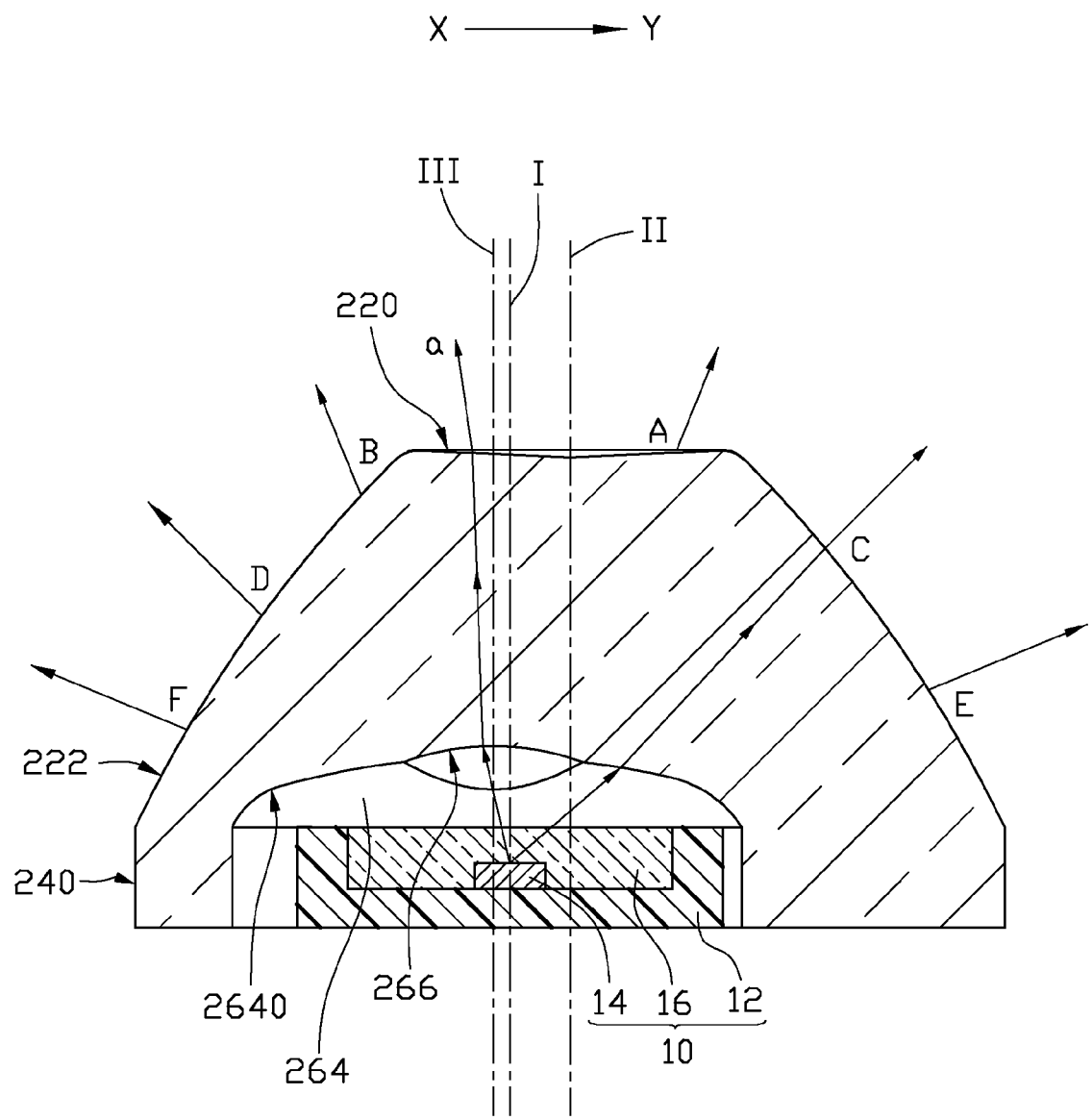
FIG. 3 is a cross-sectional view of the LED module of FIG. 1, taken along line III-III thereof.

FIGS. 1 to 3 illustrate an LED module in accordance with an embodiment of the present disclosure. The LED module comprises an LED 10 and a lens 20 covering the LED 10.

The LED 10 comprises a rectangular plate-shaped substrate 12 having a cavity (not labeled) defined in a top thereof, a LED chip 14 received in the cavity and an encapsulant 16 filled in the cavity and sealing the LED chip 14. Light emitted from the LED chip 14 is reflected upwardly by a surface of the substrate 12 defining the cavity, thereby improving the light emitting efficiency of the LED 10. The LED 10 has a vertical optical axis (marked as an optical axis I in FIG. 3) and a peak light intensity about the optical axis.

The lens 20 is rectangular in shape and integrally made of a transparent material with good optical performance, such as PMMA (poly (methyl methacrylate)) or PC (polycarbonate). A two dimensional coordinate (see FIG. 1) is established to have an axis X (from front to rear) corresponding to a length direction of the lens 20 and an axis Y (from left to right) corresponding to a width direction of the lens 20 and perpendicular to the axis X, both of which cooperatively define a plane perpendicular to the optical axis I of the LED 10. The lens 20 has the length larger than the width thereof. The lens 20 has an optical axis II parallel to and spaced from the optical axis I of the LED 10. The optical axis II of the lens 20 vertically extends through an origin of the X-Y coordinate. The optical axis I vertically extends through the axis Y, is located at a left side of the axis X and spaces from the optical axis II of the lens 20 a distance. In other words, the optical axis II is in the right of the optical axis I of the LED 10 (see FIG. 3). The lens 20 is symmetrical to the axis Y (see FIG. 4).

The lens 20 comprises a base 24 and a light conducting portion 22 protruding upwards from a top of the base 24. The base 24 has a circumferential surface (not labeled) perpendicular to the plane cooperatively formed by the axes X and Y. The circumferential surface is formed by two rectangular surfaces 240 at two opposite sides of the base 24 and two arc surfaces 242 at two opposite ends of the base 24. The light conducting portion 22 has a top surface taken as an emission surface formed by a major surface 220 and two ellipsoid minor surfaces 222 slantwise at two opposite sides of the major surface 220. The optical axis II of the lens 20 vertically extends through a center of the major surface 220. The major surface 220 continuously extends from one of the arc surfaces 242 towards another arc surface 242 and connects the arc surfaces 242 together. The major surface 220 is progressively narrower upwardly from two opposite ends thereof to the center thereof; that is, a width of the major surface 220 decreases from two ends toward the center thereof. The ellipsoid minor surfaces 222 connect the rectangular surfaces 240 with the major surface 220 and widths of the ellipsoid minor surfaces 222 gradually decreases along an upward direction.

The lens 20 defines a rectangular groove 260 in a bottom thereof. The groove 260 is close to a left side of the lens 20. A positioning groove 262 is defined by the lens 20, located over a middle portion of the groove 260 and communicating with the groove 260. The positioning groove 262 has an area identical to that of the substrate 12 of the LED 10, thereby receiving the substrate 12 in the positioning groove 262. The groove 260 is used to avoid a bonding pad (not shown) of the LED 10 from interfering with the lens 20 when accommodating the LED 10 in the lens 20. A receiving groove 264 is elliptical in shape, defined by the lens 20 and located over a middle portion of the positioning groove 262 and communicating with the positioning groove 262. The receiving groove 264 has two opposite short sides thereof expanding outwardly towards left and right sides of the lens 20 and beyond the positioning groove 262. The receiving groove 264 has a curved surface 2640 at a ceiling thereof. The curved surface 2640 has an optical axis III parallel to and spaced from the optical axis I of the LED 10. The optical axis III vertically extends through the axis Y, and is located at a left side of the optical axis I of the LED 10 and spaces therefrom a distance (see FIG. 3). The distance between the optical axes I and II is larger than that between the optical axes I and III so that most of the light emitted from the LED 10 is refracted rightwards out of the lens 20. A middle portion of the receiving groove 264 is recessed upwards to form a spherical surface 266 having an optical axis (not labeled) coincidental to the optical axis III. The spherical surface 266 and the curved surface 2640 are taken as an incidence surface to refract the light emitted from the LED 10 out of the top surface of the light conducting portion 22 of the lens 20. The spherical surface 266 refracts the light (see the beam a in FIG. 3) about the optical axis I to emit out of the top surface of the lens 20, in which the light beam has a quite large light intensity.

In the direction of the axis Y, most of the light emitted from the LED 10 is refracted out of the lens 20 and directed rightwards. With an increase of the angle between light beam and the optical axis I, the light intensity in the right side of the lens 20 firstly increases and then decreases from the optical axis I to positions A, C, E in sequence, wherein the peak light intensity occurs at position A, and the zero light intensity occurs at position E. With the increase of the angle between light beam and the optical axis I, the light intensity in the left side of the lens 20 keeps decreasing from the optical axis I to positions B, D, F, wherein the zero light intensity occurs at position F.

Figure 4:
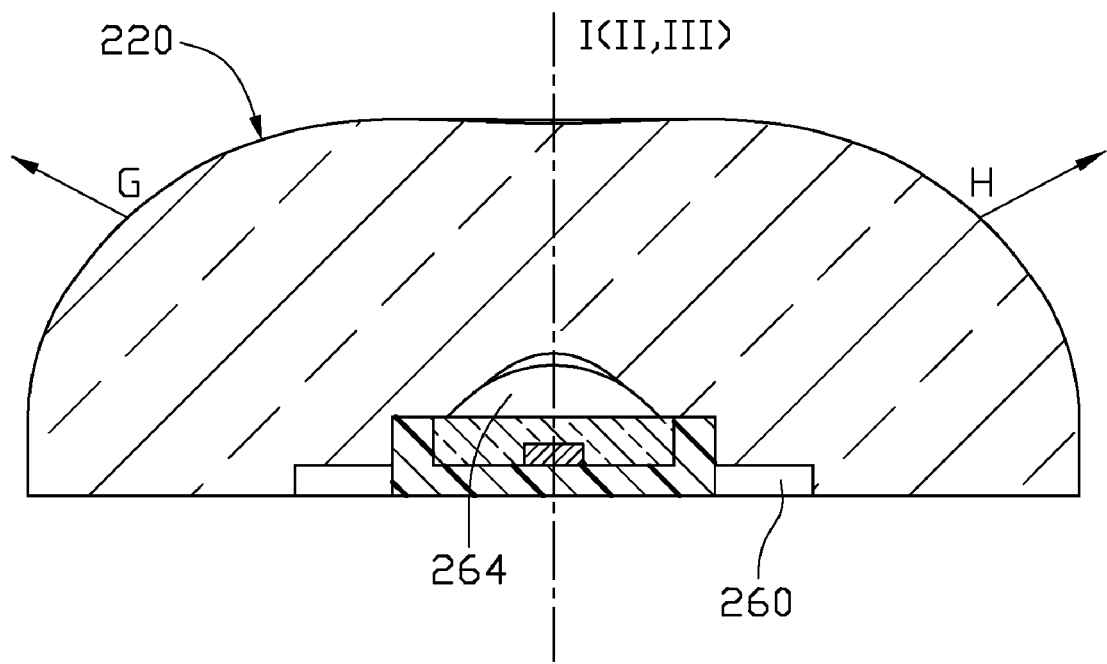
FIG. 4 is a cross-sectional view of the LED module of FIG. 1, taken along line IV-IV thereof.

Also referring to FIG. 4, In the direction of the axis X, with the increase of the angle between light beam and the optical axis I, the light intensity firstly increases and then rapidly decreases from the optical axis I to the left and right sides of the lens 20, wherein the peak light intensity occurs at positions G and H. When the angle increases to 90 degrees, none light beams emit out of the lens 20.

When the LED module is utilized in a LED street lamp on a side of a road, the lens 20 of the LED module is arranged in such a manner that the axis X thereof is parallel to the longitudinal direction of the road and the axis Y thereof is parallel to the transversal direction of the road. The light emitted from the LED 10 is refracted by the lens 20 to form a substantially elongated illumination region on the road. An illumination area along the longitudinal direction of the road is larger than that along the transversal direction of the road. The illumination area formed by the LED module at the right side of the Y axis is larger than that at the left side, in which the right side is near a middle of the road; thus, along the transversal direction of the road, more light can be directed towards the middle of the road to thereby provide a sufficient illumination for the middle of the road. Therefore, it is not necessary to design an inclined supporting frame for directing the light of the LED 10 to the middle of the road, thereby reducing a design and assembly cost. It is convenient to assemble the lens 20 and the LED 10 together since the assembly thereof is quite simple and can be automated, while the automation is not feasible when the LED is mounted to an inclined supporting frame.

It is noted that a plurality of such LED modules can be integrated on a transparent frame to intensify luminous intensity of the light from the LED modules. In this embodiment, the optical axes I and II are parallel to and spaced from each other. In other embodiments, the optical axes I and II intersects with each other at an angle.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An LED module comprising:
an LED having a first optical axis; and
a lens fixed over the LED for refracting light emitted from the LED, the lens having
a second optical axis, the second optical axis extending through an origin of an X-Y coordinate consisting of X-axis and Y-axis perpendicular to each other;
wherein the second optical axis of the lens offsetting from the first optical axis of the LED in a first direction for increasing a light intensity of the light generated by the LED and through the lens at a side of the first optical axis of the LED in the first direction, the first optical axis extending through the Y-axis and spacing a distance from the second optical axis a distance along a second direction opposite the first direction.

2. The LED module as claimed in claim 1, wherein the first direction extends along the Y-axis, the first optical axis being perpendicular to a plane cooperatively formed by the X-axis and the Y-axis.

3. The LED module as claimed in claim 2, wherein the first optical axis of the LED is parallel to the second optical axis of the lens.

4. The LED module as claimed in claim 3, wherein the lens comprises a base and a light conducting portion protruding upwards from a top of the base, the light conducting portion having a major surface at a middle thereof.

5. The LED module as claimed in claim 4, wherein the light conducting portion of the lens further comprises two ellipsoid minor surfaces slantwise at two opposite sides of the major surface, the major surface and the ellipsoid minor surfaces cooperatively forming an emission surface for an emission of the light emitted from the LED.

6. The LED module as claimed in claim 5, wherein a width of the major surface progressively decreases from two opposite ends to a center thereof, and widths of the ellipsoid minor surfaces progressively decrease along an upward direction, and wherein the LED is received in a bottom of the lens, and the second optical axis extends through the center of the major surface.

7. The LED module as claimed in claim 5, wherein the base of the lens comprises a circumferential surface perpendicular to the plane cooperatively formed by the X-axis and the Y-axis, the emission surface connecting with and extending upwardly from the circumferential surface.

8. The LED module as claimed in claim 4, wherein a receiving groove is defined in a bottom of the lens and has a curved surface corresponding to the LED, the curved surface having a third optical axis parallel to and spaced from the first optical axis of the LED.

9. The LED module as claimed in claim 8, wherein the second and third optical axes are located at two opposite sides of the first optical axis, respectively, along the Y-axis.

10. The LED module as claimed in claim 9, wherein a distance between the first and second optical axes is larger than that between the first and third optical axes.

11. The LED module as claimed in claim 8, wherein the first, second and third optical axes are all extended through the Y-axis.

12. The LED module as claimed in claim 11, wherein the lens is symmetrical relative to the Y-axis.

13. The LED module as claimed in claim 8, wherein a middle portion of the receiving groove is recessed upwards to form a spherical surface having a fourth optical axis coincidental to the third optical axis.

14. An LED module comprising:
an LED having a first optical axis; and
a lens fixed over the LED for refracting light emitted from the LED, the lens comprising an emission surface having a second optical axis and an incidence surface having a third optical axis, the second optical axis extending through a center of the lens and an origin of an X-Y coordinate consisting of X-axis and Y-axis perpendicular to each other;
wherein the second optical axis of the emission surface offsetting from the first optical axis of the LED in a first direction for increasing a light intensity at a side of the first optical axis in the first direction, the first direction being along the Y-axis, the first and third optical axes extending through the Y-axis, the lens being elongated with two opposite short ends and two opposite long sides, the Y-axis extending across the two opposite long sides.

15. The LED module as claimed in claim 14, wherein the lens defines a receiving groove in a bottom thereof, the LED being received in the receiving groove, the lens further defining a curved surface over the receiving groove, the curved surface defining the third optical axis, the first, second and third optical axes being parallel to each other.

16. The LED module as claimed in claim 15, wherein the second and third optical axes are located at two opposite sides of the first optical axis, respectively.

17. The LED module as claimed in claim 16, wherein a distance between the first and second optical axes is larger than that between the first and third optical axes so that most of light emitted from the LED emits towards a side of the lens beside the first optical axis and through which the second optical axis extends.

* * * * *